(12) United States Patent
Tseng

(10) Patent No.: US 8,878,627 B2
(45) Date of Patent: Nov. 4, 2014

(54) MONOLITHIC POWER SPLITTER FOR DIFFERENTIAL SIGNAL

(75) Inventor: Shih-Hsien Tseng, Hsinchu County (TW)

(73) Assignee: Cyntec Co., Ltd., Hsinchu (TW)

( * ) Notice: Subject to any disclaimer, the term of this patent is extended or adjusted under 35 U.S.C. 154(b) by 423 days.

(21) Appl. No.: 13/097,072

(22) Filed: Apr. 29, 2011

(65) Prior Publication Data

US 2012/0274413 A1 Nov. 1, 2012

(51) Int. Cl.
*H01P 5/12* (2006.01)
*H03H 7/48* (2006.01)
*H03H 1/00* (2006.01)
*H03H 7/21* (2006.01)

(52) U.S. Cl.
CPC ......... *H03H 7/48* (2013.01); *H03H 2001/0021* (2013.01); *H03H 7/21* (2013.01)
USPC ............ 333/100; 333/126; 333/129; 333/132

(58) Field of Classification Search
USPC .......................... 333/125–128, 134, 136, 132
See application file for complete search history.

(56) References Cited

U.S. PATENT DOCUMENTS

| | | | | |
|---|---|---|---|---|
| 6,407,648 B1 * | 6/2002 | Johnson | ........................ | 333/127 |
| 7,199,681 B2 * | 4/2007 | Amirtharajah et al. | ........ | 333/130 |
| 7,646,262 B2 * | 1/2010 | Kannell | ........................ | 333/125 |
| 7,965,532 B2 * | 6/2011 | Greeff et al. | .................... | 365/63 |
| 2011/0063048 A1 * | 3/2011 | Floyd et al. | .................... | 333/136 |
| 2011/0163819 A1 * | 7/2011 | Badillo et al. | ............ | 331/108 B |

* cited by examiner

*Primary Examiner* — Robert Pascal
*Assistant Examiner* — Kimberly Glenn
(74) *Attorney, Agent, or Firm* — Min-Lee Teng; Litron Patent & Trademark Office

(57) ABSTRACT

A monolithic power splitter is used to split a pair of input differential signals into two pairs of output differential signals in the present invention. The monolithic power splitter has two input terminals to receive a pair of input differential signals, and it has two one-by-two power splitters integrated in one single chip to split a pair of input differential signals into two pairs of output differential signals with equal power. And, the monolithic power splitter has four output terminals to output two pairs of output differential signals. In one embodiment, the first one-by-two power splitter and the second one-by-two power splitter are made on the same surface of the substrate. In another embodiment, the first one-by-two power splitter and the second one-by-two power splitter are made on opposite surfaces of the substrate. The monolithic power splitter can be used as a power combiner based on the reciprocal property of the power splitter circuit.

21 Claims, 14 Drawing Sheets

MONOLITHIC POWER SPLITTER FOR DIFFERENTIAL SIGNAL

BACKGROUND OF THE INVENTION

1. Field of the Invention

The present invention relates to a monolithic power splitter, and more particularly, to a monolithic power splitter for splitting a pair of input differential signals into two pairs of output differential signals.

2. Description of the Prior Art

A power splitter is widely applied in the modern electrical system; it is used to split an input signal to two output signals with equal power. Please refer to FIG. 1A. A one-by-two power splitter 2 receives an input signal $S_i$ and outputs two output signals $S_{o1}$, $S_{o2}$, wherein the $S_{o1}$ and $S_{o2}$ have equal power. The output signals $S_{o1}$ and $S_{o2}$ are directed to a device 4 via two transmission lines 6 and 8. Similarly, please refer to FIG. 1B. A one-by-two power splitter 10 receives an input signal $S_i$ and outputs two output signals $S_{o1}$ and $S_{o2}$, which are respectively directed to two discrete devices 12 and 14 via two transmission lines 16 and 18. In many applications, the device 4, 12, and 14 may be a receiver, a transformer, or an amplifier, etc. . . .

It is well known that the differential signal, a pair of signals which have equal amplitude and have 180 degree phase difference mutually, can eliminate the transmission noise. Therefore, the differential signal is commonly adopted for the high-quality signal transmission, especially for the Radio Frequency (RF) signal transmission and high-speed signal inter-communication. Therefore, it is popularly utilized in many application fields, such as the telecommunication, Ethernet, the Universal Serial Bus (USB), Display-Port, High-Definition Multimedia Interface (HDMI), etc.

Please refer to FIG. 2. Two separate transmission lines 20 and 22 are used to transmit a pair of differential signals $S^+$ and $S^-$ respectively. In general, the length of the transmission lines 20 and 22 is the same to make their transmission impedance be equal, and thus the insertion loss of the differential signal $S^+$ and $S^-$ be equal.

Accordingly, a power splitter for a pair of input differential signals needs to be implemented in many situations. Conventionally, it is implemented by utilizing two one-by-two power splitters which are configured in two separate chips. Please refer to FIG. 3. A chipset 30, which is mounted on a printed circuit Board (PCB) 60 and transmits a pair of input differential signals $S^+$ and $S^-$ to two one-by-two power splitters 36 and 38 respectively. The two one-by-two splitter 36 and 38 are formed in two discrete chips 40 and 42 respectively, and they split the input differential signal $S^+$ and $S^-$ into four output signal $S_1^+$, $S_2^+$, $S_1^-$, and $S_2^-$ with equal power.

Please continuously refer to FIG. 3. The four output signals $S_1^+$, $S_2^+$, $S_1^-$, and $S_2^-$ are respectively transmitted to another chipset 52 mounted on the PCB 60 via the transmission lines 44, 46, 48, and 50, which are lied on the PCB 60. In order to achieve the goal of low-noise transmission, the signals $S_1^+$, $S_2^+$, $S_1^-$, and $S_2^-$ are transmitted in two pairs of differential signals. For example, $S_1^+$ and $S_1^-$ are one pair, and $S_2^+$ and $S_2^-$ is another pair in FIG. 3. Because the two one-by-two power splitters 36 and 38 are formed in two discrete chips 40 and 42, it is very difficult to make the length of the four transmission lines 44, 46, 48, and 50 be equal. Therefore, the four transmission lines 44, 46, 48, and 50 will easily have different transmission impedance. Moreover, the crossed-PCB-routing will make some signal interference with each other. Thus the signals $S_1^+$, $S_2^+$, $S_1^-$, and $S_2^-$ will have different insertion loss. This is a serious problem needed to be overcome.

Furthermore, such kind of conventional implementation that two one-by-two power splitters are formed in two discrete chips has many other disadvantages including: a. it occupies large PCB space, so it is large and expensive. b. The electrical characteristics of two separated one-by-two power splitters may not be the same since they may be made from different process. c. It needs long transmission length, which will damage the signal quality.

Accordingly, the present invention proposes a monolithic power splitter for splitting a pair of input differential signals into two pairs of output differential signals, which integrates two one-by-two splitters in a single chip made by the single process to overcome the above mentioned problems and disadvantages.

SUMMARY OF THE INVENTION

One objective of the present invention is to provide a monolithic power splitter for Splitting a pair of input differential signals into two pairs of output differential signals. It integrates two one-by-two power splitters into a single chip. It merely needs smaller PCB space and shorter transmission length and uniform process is applied on two one-by-two power splitters, so that it can get better balance characteristics and good signal quality.

The present invention discloses that a monolithic power splitter for splitting a pair of input differential signal into two pairs of output differential signals, comprising: a first input terminal to receive a first input signal of the pair of input differential signals; a second input terminal to receive a second input signal of the pair of input differential signals, wherein the first input signal and the second input signal have substantially equal amplitude and 180 degree phase difference; a first one-by-two power splitter to split the first input signal into a first output signal and a second output signal, comprising a first input end electrically connected with the first input terminal, a first output end to output the first output signal, and a second output end to output the second output signal; a second one-by-two power splitter to split the second input signal into a third output signal and a fourth output signal, comprising a second input end electrically connected with the first input terminal, a third output end to output the third output signal, and a fourth output end to output the fourth output signal; and four output terminals to output two pairs of output differential signals, consisting of a first output terminal, a second output terminal, a third output terminal and a fourth output terminal, wherein the first output end, the second output end, the third output end, and the fourth end are one-to-one electrically connected to the four output terminals respectively.

One embodiment in the present invention is to provide a monolithic power splitter comprising a first one-by-two power splitter and a second one-by-two power splitter made on the same surface of the substrate. Another embodiment of the present invention is to provide a monolithic power splitter comprising a first one-by-two power splitter and a second one-by-two power splitter made on opposite sides of the substrate.

Since the power splitter is a reciprocal passive device, anther embodiment in the present invention is to provide a monolithic power combiner by using the same circuit of the monolithic power splitter to combine two pairs of differential signals into one pair of differential signal. The directions of all the inputs and outputs of the differential signals in a monolithic power splitter are reversed when the monolithic power splitter is used as a monolithic power combiner while maintaining the advantages of the monolithic power splitter in terms of circuit characteristics.

One objective of the present invention is to provide a method for manufacturing a monolithic power splitter comprising a first one-by-two power splitter and a second one-by-two power splitter made on the same surface of the substrate. Another objective of the present invention is to provide a method for manufacturing a monolithic power splitter comprising a first one-by-two power splitter and a second one-by-two power splitter made on opposite surfaces of the substrate.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

Circuit Description

Figure 1A:
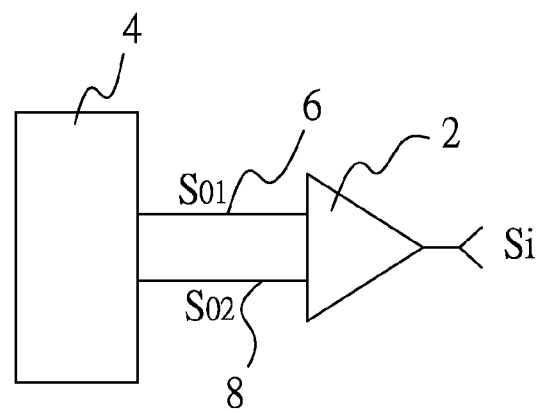
FIG. 1A and FIG. 1B are a perspective illustration of a one-by-two power splitter.
Figure 1B:
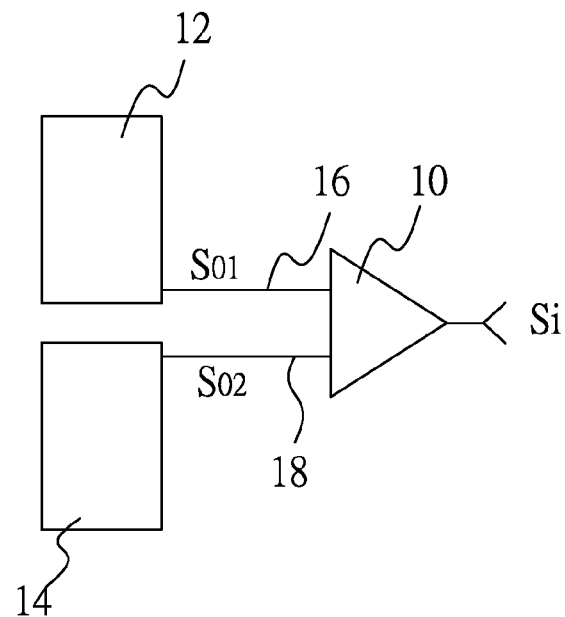
Figure 2:
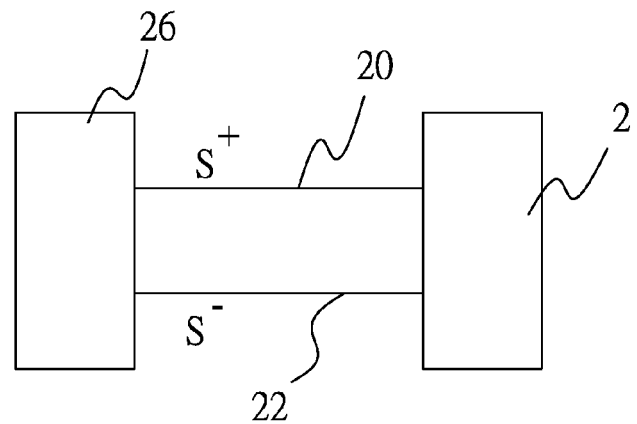
FIG. 2 is a perspective illustration of two separate transmission line used to transmit a pair of differential signals.
Figure 3:
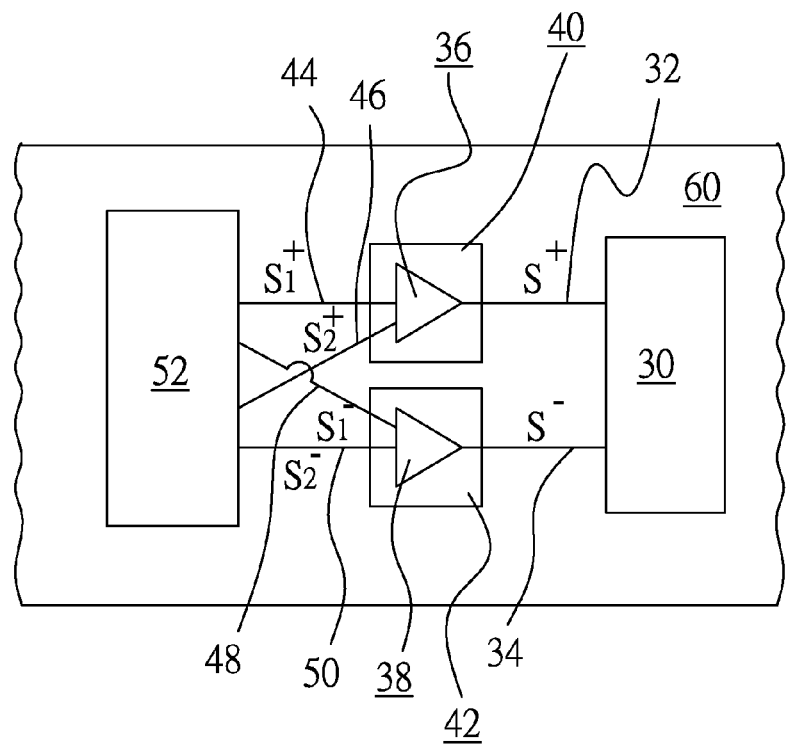
FIG. 3 is a perspective illustration of the four output signal from two one-by-two power splitters transmitted to another chipset mounted on the PCB respectively.
Figure 4:
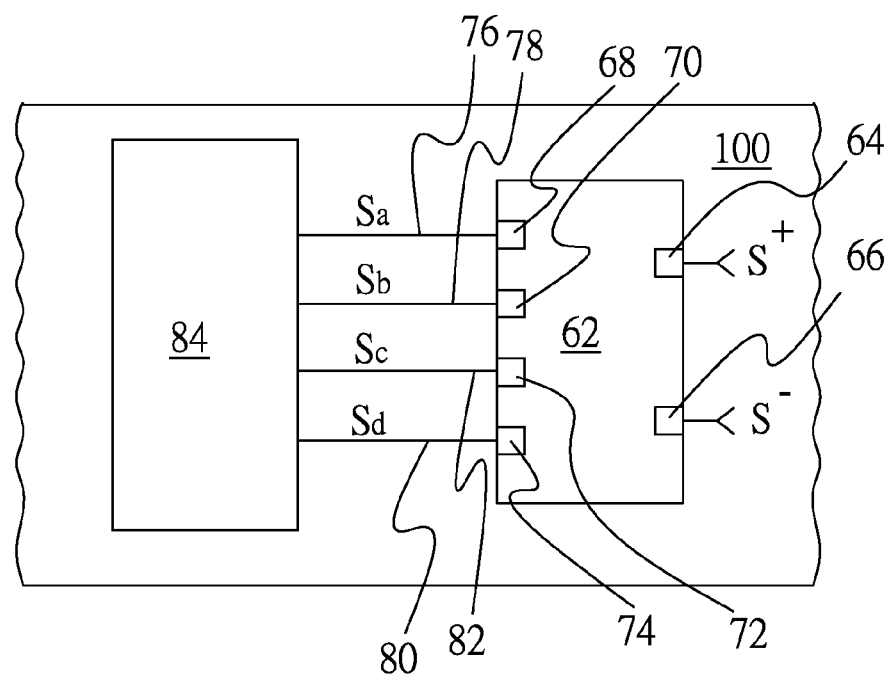
FIG. 4 is a schematic diagram showing the basic operation of the monolithic power splitter for splitting a pair of differential signals in the present invention.

Please refer to FIG. 4. It is a schematic diagram showing the basic operation of the monolithic power splitter for splitting a pair of input differential signals into two pairs of output differential signals in the present invention. A monolithic power splitter 62 mounted on a PCB 100 is used to split a pair of input differential signals $S^+$ and $S^-$. The monolithic power splitter 62 has two input terminals 64 and 66 to respectively receive $S^+$ and $S^-$, and it has two one-by-two splitters (not shown in FIG. 4) to split the pair of input differential signals $S^+$ and $S^-$ into two pairs of output differential signals $S_a$, $S_b$, $S_c$, and $S_d$ with equal power. And, the monolithic power splitter 62 has four output terminals 68, 70, 72, and 74 to output the two pairs of output differential signals $S_a$, $S_b$, $S_c$, and $S_d$.

Please continuously refer to FIG. 4. The two pairs of output differential signals $S_a$, $S_b$, $S_c$, and $S_d$ are respectively transmitted to another chipset 84 mounted on the PCB 100 via the transmission line 76, 78, 80, and 82, which are lied on the PCB 100. Because two one-by-two power splitters (not shown in FIG. 4) of the monolithic power splitter 62 are formed in one single chip, it is very easy to make the length of the four transmission lines 76, 78, 80, and 82 equal and to prevent crossing issue. Therefore, the four transmission lines 76, 78, 80, and 82 will have equal transmission impedance and the two pairs of output differential signals $S_a$, $S_b$, $S_c$, and $S_d$ will have equal insertion loss. This is an important advantage comparing to the prior art described previously.

Besides, there are many advantages of the monolithic power splitter having two one-by-two power splitters according to the present invention mentioned above, which includes:
a. It occupies smaller PCB space, so it is smaller and cheaper.
b. It needs shorter transmission length, which can keep good signal quality, in order to be used as inter-communication for Display-Port and HDMI 1.4 high-speed signal. c. The electrical characteristics of two one-by-two power splitters can be as closer as possible. Thus the crossed-PCB-routing could be avoided so as to improve the signal quality.

Consequently, one feature of the present invention is that two one-by-two splitters are integrated in one single chip.

There are four types of configurations to implement the monolithic power splitter having two one-by-two power splitters according to the present invention, which are described in the following.

Please refer to FIG. 5A to FIG. 5D, which are four schematic diagrams to demonstrate different configurations to implement the monolithic power splitter having two one-by-two splitters in the present invention.

Firstly, in these four schematic diagrams, the monolithic power splitter 62 for splitting a pair of input differential signals $S^+$ and $S^-$, the two input terminal 64 and 66, two pairs of output differential signals $S_a$, $S_b$, $S_c$, and $S_d$, and the four output terminal 68, 70, 72, and 74 are the same with those in FIG. 4. And, all of the configurations have two one-by-two power splitters 110 and 120, which splits a pair of input differential signals $S^+$ and $S^-$ into four output signals $S_1^+$, $S_2^+$, $S_1^-$, and $S_2^-$ with equal power respectively. The two one-by-two power splitters 110 and 120 have an input end 112 and 122 respectively, and they are electrically connected to the input terminal 64 and 66 to receive a pair of input differential signals $S^+$ and $S^-$ respectively; and they respectively have two output ends 114, 116 and 124, 126. It is easy for a person skilled in the art to understand from the figures that there are two ways to make up two pairs of output differential signals for all of the four configurations. The first way is that one pair is made by ($S_1^+$, $S_1^-$), and another pair is made by ($S_2^+$, $S_2^-$). The second way is that one pair is made by ($S_1^+$, $S_2^-$), and another pair is made by ($S_2^+$, $S_1^-$).

Next, the difference of the four types of configurations is explained as follows.

Figure 5A:
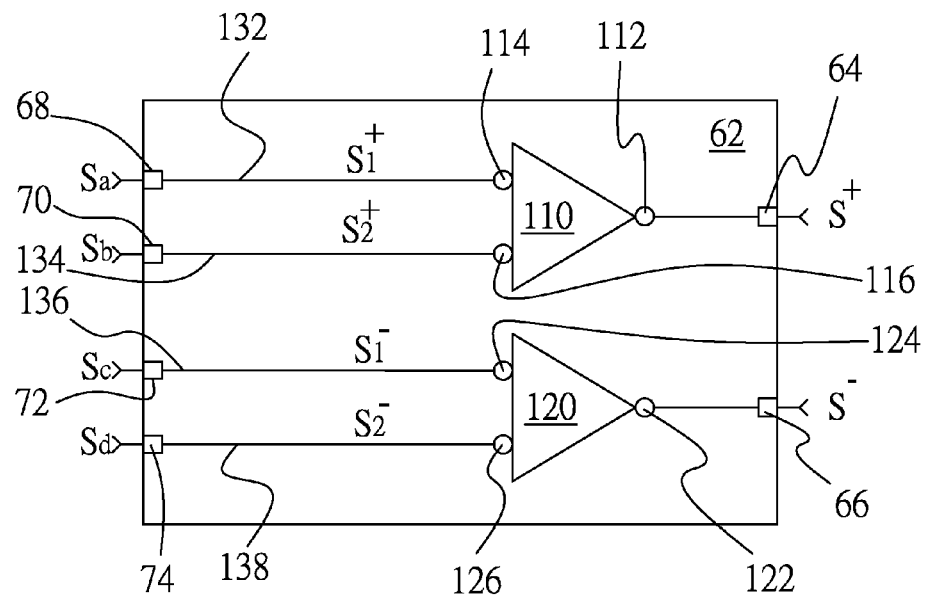
FIG. 5A~FIG. 5D are four schematic diagrams to demonstrate different configurations to implement the monolithic power splitter having two one-by-two splitters in the present invention.

The first configuration is illustrated in FIG. 5A, the output ends 114, 116, 124, and 126 are electrically connected to the output terminals 68, 70, 72, and 74 via the conductive leads 132, 134, 136, and 138 respectively. Therefore, two pairs of output differential signals $S_a$, $S_b$, $S_c$, and $S_d$ are respectively equal to $S_1^+$, $S_2^+$, $S_1^-$, and $S_2^-$. Because the power splitter 62 in the present invention is monolithic, the conductive leads 132, 134, 136, and 138 can be formed on different metal layer. Therefore, the conductive leads 132, 134, 136, and 138 can be designed and implemented to have equal conductive length and transmission impedance, such two pairs of output differential signals with equal insertion loss can be composed of $S_1^+$, $S_2^+$, $S_1^-$, and $S_2^-$.

Figure 5B:
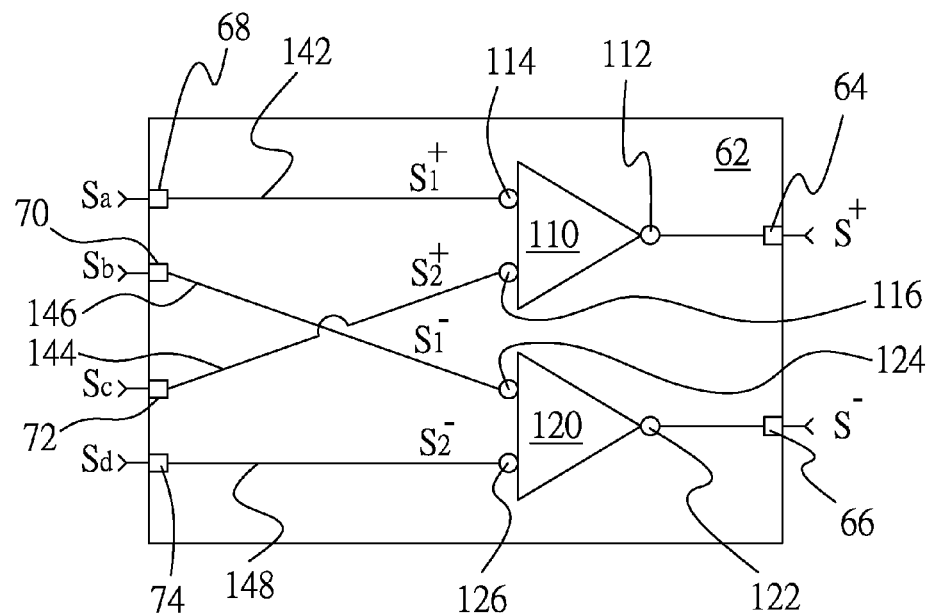

The second configuration is illustrated in FIG. 5B, the output ends 114, 116, 124, and 126 are electrically connected to the output terminals 68, 72, 70, and 74 via the conductive leads 142, 144, 146, and 148 respectively. Therefore, two pairs of output differential signals $S_a$, $S_b$, $S_c$, and $S_d$ are respectively equal to $S_1^+$, $S_1^-$, $S_2^+$, and $S_2^-$. Similar to the first configuration, two pairs of output differential signals with equal insertion loss can be composed of $S_1^+$, $S_2^+$, $S_1^-$, and $S_2^-$. It does not further explain herein.

Figure 5C:
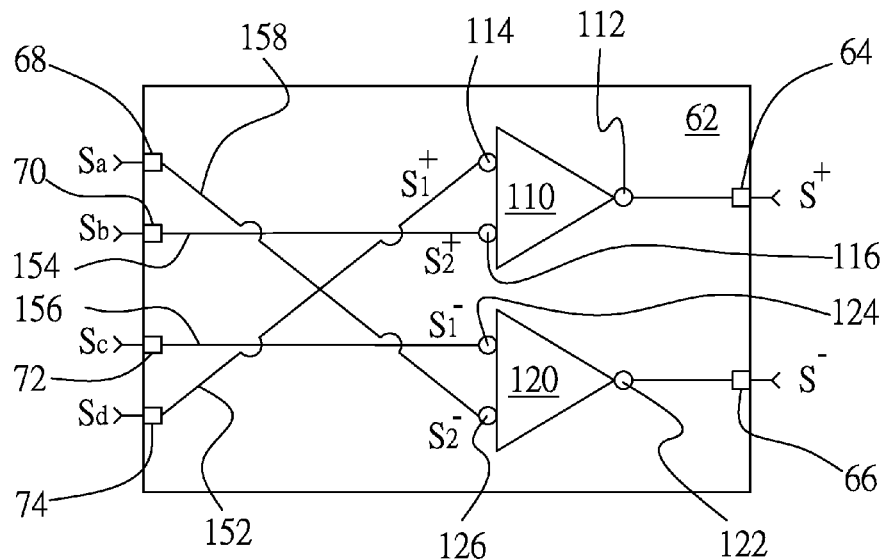

The third configuration is illustrated in FIG. 5C, the output ends 114, 116, 124, and 126 are electrically connected to the output terminals 74, 70, 72, and 68 via the conductive leads 152, 154, 156, and 158 respectively. Therefore, two pairs of output differential signals $S_a$, $S_b$, $S_c$, and $S_d$ are respectively equal to $S_2^-$, $S_2^+$, $S_1^-$, and $S_1^+$. Similar to the first configuration, two pairs of output differential signals with equal insertion loss can be composed of $S_1^+$, $S_2^+$, $S_1^-$, and $S_2^-$. It does not further explain herein.

Figure 5D:
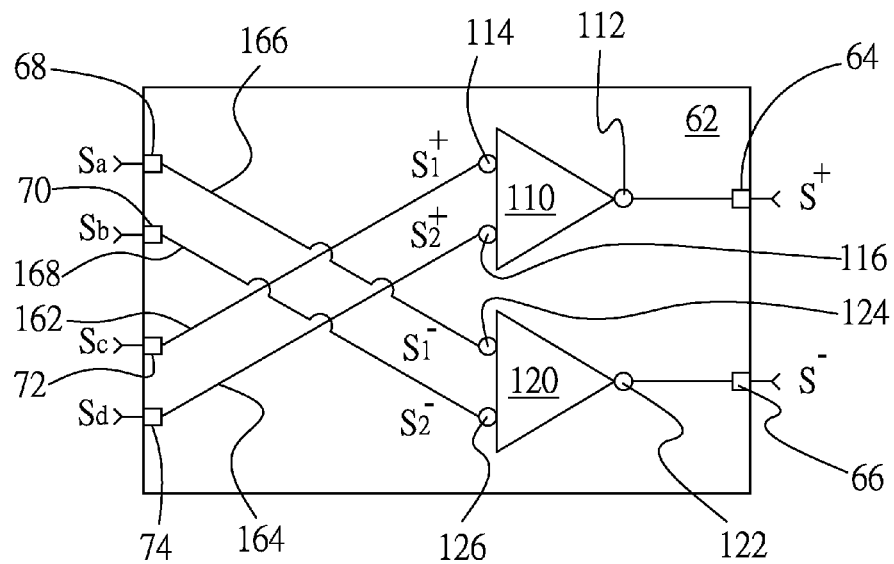

The fourth configuration is illustrated in FIG. 5D, the output ends 114, 116, 124, and 126 are electrically connected to the output terminals 72, 74, 68, and 70 via the conductive leads 162, 164, 166, and 168 respectively. Therefore, two pairs of output differential signals $S_a$, $S_b$, $S_c$, and $S_d$ are respectively equal to $S_1^-$, $S_2^-$, $S_1^+$, and $S_2^+$. Similar to the first configuration, two pairs of output differential signals with equal insertion loss can be composed of $S_1^+$, $S_2^+$, $S_1^-$, and $S_2^-$. It does not further explain here.

To make a brief summary for the four types of configurations described above, all of them can achieve the goal of the present invention, outputting two pairs of output differential signals with equal insertion loss.

According to the spirit of the present invention, there are two types of one-by-two splitter can be adopted by the present invention. They are described as follows.

Figure 6A:
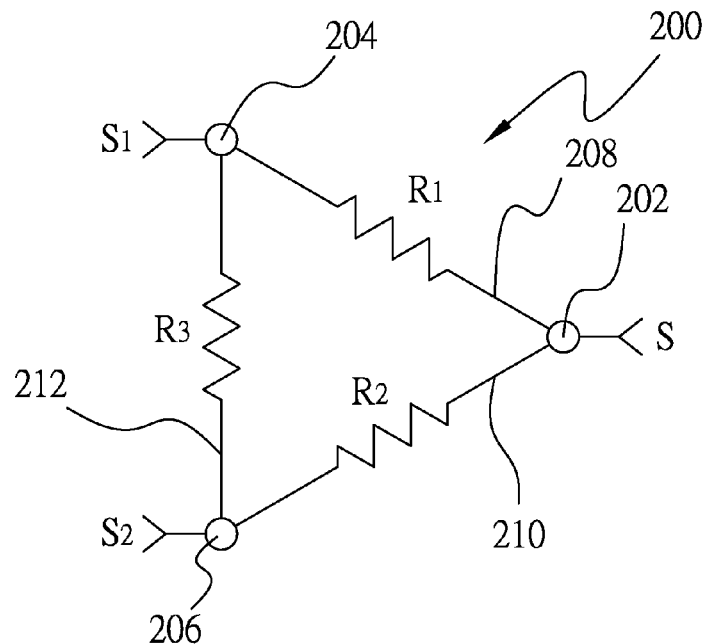
FIG. 6A and FIG. 6B are a perspective illustration of Δ-type one-by-two power splitter and Y-type one-by-two power splitter respectively.

Please refer to FIG. 6A. A Δ-type one-by-two power splitter 200 has an input end 202 to receive an input signal S; two output ends 204 and 206 to output two output signal $S_1$ and $S_2$, wherein the $S_1$ and $S_2$ have substantially equal power; two branches 208 and 210 to electrically connect the input end 202 with the output ends 204 and 206 respectively; one output branch 212 electrically connects the output end 204 and 206; and three resistors $R_1$, $R_2$, and $R_3$ are arranged in branch 208, branch 210, and the output branch 212 respectively; wherein the resistance of $R_1$ and $R_2$ are equal to equally split the input power. In a preferred practical embodiment, it is easy for a person skilled in the art to know how to design and implement the whole circuit to make the branch 208 and 210 having substantially equal impedance, and thus the output signal $S_1$ and $S_2$ will experience substantially equal insertion loss caused by the Δ-type one-by-two power splitter 200. Therefore, it does not further describe herein.

Figure 6B:
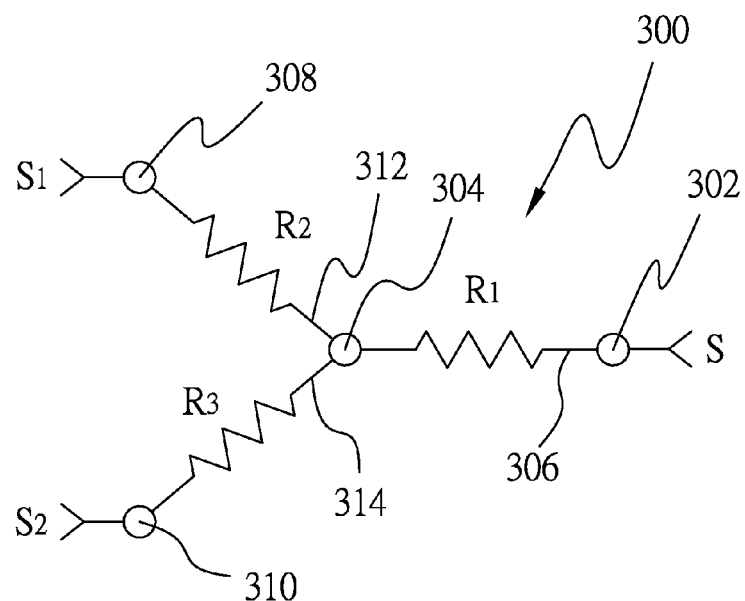

Please refer to FIG. 6B. A one-by-two Y-type power splitter 300 has an input end 302 to receive an input signal S; an input node 304 electrically connected with the input end 302 via an input branch 306; two output ends 308 and 310 to output two output signal $S_1$ and $S_2$, wherein the $S_1$ and $S_2$ have substantially equal power; two branch 312 and 314 to electrically connect the input node 304 with the output end 308 and 310 respectively; and three resistors $R_1$, $R_2$, and $R_3$ are arranged in the input branch 306, branch 312, and branch 314 respectively; wherein the resistance of $R_2$ and $R_3$ are equal to equally split the input power. Similarly, in a preferred practical embodiment, the branch 312 and 314 have substantially equal impedance, and thus the output signal $S_1$ and $S_2$ will experience substantially equal insertion loss caused by the Y-type one-by-two power splitter 300.

To make a brief summary for the Δ-type and Y-type one-by-two power splitter described above, both of them can achieve the goal of splitting the input signal into two output signals with equal power, and the two output signals may experience substantially equal insertion loss. Moreover, it is easy for a person skilled in the art to understand how to design and implement $R_1$, $R_2$, and $R_3$ of either Δ-type or Y-type one-by-two power splitter to make the power of the output signal $S_1$ and $S_2$ be equal, no matter how they are output from the Δ-type or the Y-type one-by-two power splitter. Therefore, the two one-by-two power splitters of the monolithic power splitter of the present invention may adopt different type, such as a Δ-type and a Y-type one-by-two power splitter.

Another embodiment of the present invention is to use the power splitter as a power combiner based on the reciprocal property of the power splitter circuit. Please refer back to FIG. 4, which also illustrates a schematic diagram to demonstrate the basic operation of the monolithic power combiner for combining two pairs of input differential signals into one pair of output differential signals. A monolithic power combiner 62 mounted on a PCB 100 is used to combine two pairs of input differential signals $S_a$, $S_b$, $S_c$, and $S_d$. The monolithic power combiner 62 has two output terminals 64 and 66 to respectively transmit $S^+$ and $S^-$. The monolithic power combiner 62 has two two-by-one combiners (not shown in FIG. 4) to combine two pairs of input differential signals $S_a$, $S_b$, $S_c$, and $S_d$ into one pair of output differential signals $S^+$ and $S^-$ with equal power respectively. The monolithic power combiner 62 has four input terminals 68, 70, 72, and 74 to receive two pairs of input differential signals $S_a$, $S_b$, $S_c$, and $S_d$, respectively.

Please continuously refer to FIG. 4. The two pairs of input differential signals $S_a$, $S_b$, $S_c$, and $S_d$ are respectively received from chipset 84 mounted on the PCB 100 via the transmission line 76, 78, 80, and 82. Because the two two-by-one power combiners (not shown in FIG. 4) of the monolithic power combiner 62 are formed in one single chip, it is easy to make the length of the four transmission lines 76, 78, 80, and 82 equal so as to prevent crossing issue.

Please refer to FIG. 5A to FIG. 5D, which illustrate four different configurations to implement the monolithic power combiner. The details are easily comprehended by those skilled in the art based on the reciprocal property, and they are not further described herein.

The above description refers to the circuit level of the present invention. The following description will refer to the structures and the manufacturing method of the present invention. The described preferred embodiments are presented with illustrations and description. They are not intended to limit the scope in the present invention and also not limited to other structures meeting the scope of the present invention. Various structures and manufacturing method may be practiced without one or more of the specific details, or with other methods, materials, or components. In other instances, well-known structures, materials, or operations are not shown or described in detail to avoid obscuring the scope of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. The preferred structures and manufacturing method are described in the following two embodiments.

First Embodiment

In the first embodiment, the first one-by-two power splitter 110 and the second one-by-two power splitter 120 are made on the same surface of the substrate by thin-film process. For convenience of explanation, some simplification is made and only the structure of a portion of the monolithic power splitter 62 performed by thin-film process is shown. It's also performed by printing process but not described herein.

Figure 7A:
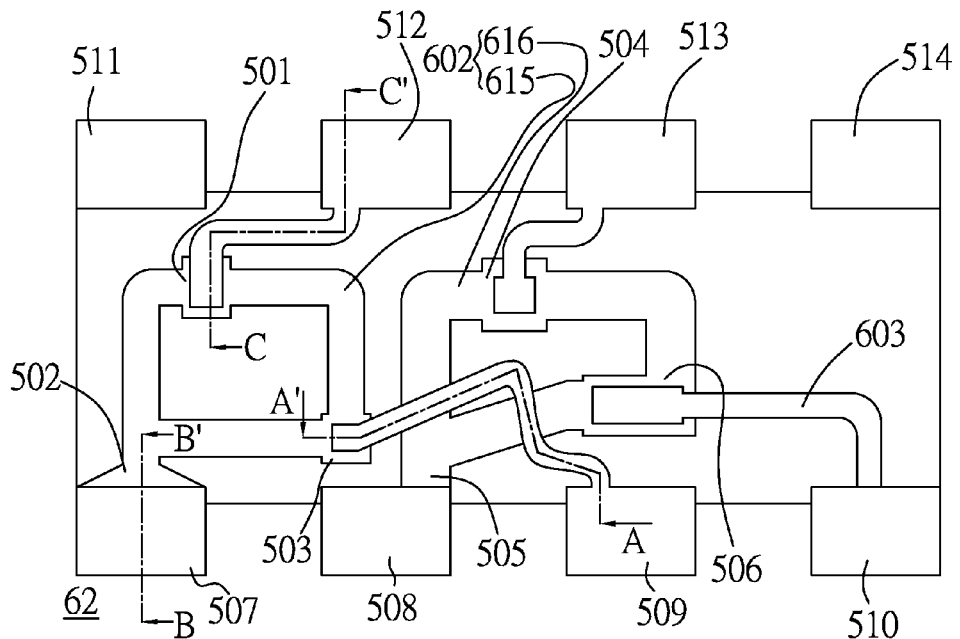
FIG. 7A is a top view of the structure of the monolithic power splitter of the first embodiment in the present invention.
Figure 7B:
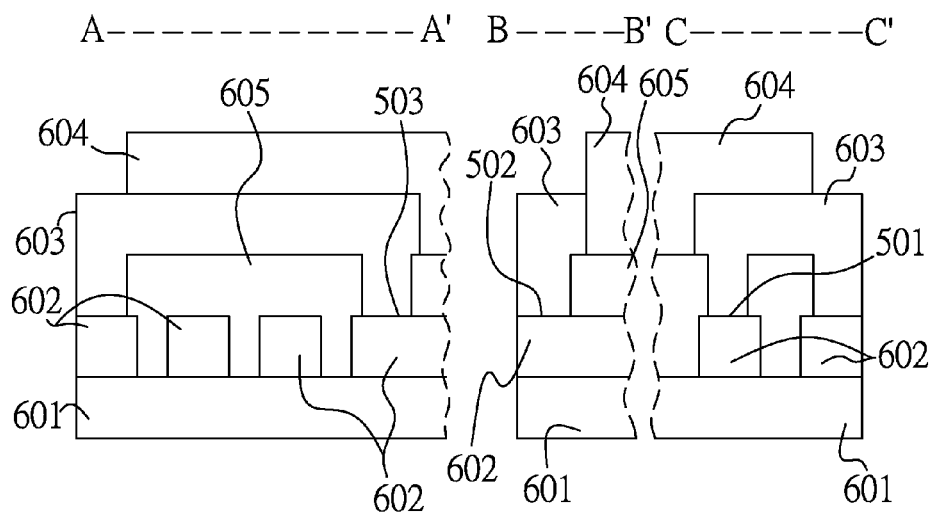
FIG. 7B is a schematic cross-sectional view of the structure of the monolithic power splitter of the first embodiment in the present invention.

FIG. 7A illustrates a top view of the structure of the monolithic power splitter 62 in the present invention. FIG. 7B illustrates a schematic cross-sectional view of the structure of the monolithic power splitter 62 in the present invention. In reference to both FIG. 7A and FIG. 7B together, sections A-A', B-B' and C-C' in FIG. 7B are taken along lines A-A', B-B' and C-C' shown in FIG. 7A respectively. For convenience of explanation, the above sections A-A', B-B' and C-C' are depicted in a single cross-sectional view respectively and combined in one figure.

As shown in FIG. 7A and FIG. 7B, the monolithic power splitter includes a substrate 601, a resistor layer 602, a conductive layer 603, a dielectric layer 605 and a protective layer 604. The resistor layer 602 is disposed on the substrate 601. The resistor layer 602 comprises a first one-by-two power splitter 615 and a second one-by-two power splitter 616. The first one-by-two power splitter 615 and the second one-by-two power splitter 616 both include three resistors which are arranged in the form of Δ-type, Y-type, or any other equivalent type, as described above.

Furthermore, in one embodiment, the pattern of the three resistors of the first one-by-two power splitter 615 and the pattern of the three resistors of the second one-by-two power splitter 616 can be made symmetrical so that the resistance and the propagation delay can be equal for a pair of signals with one signal going through the resistor(s) of 615 and the other signal going through the corresponding resistor(s) of 616 to ensure that each pair of the output differential signals has output signals with substantially equal amplitude and 180 degree phase difference.

Please note that each of the two one-by-two power splitters splits the input signal into two output signals with equal power in this embodiment, alternatively, each of the two one-by-two power splitters can split the input signal into two output signals with a fixed power splitting ration. For Example, the power splitting ration can be 2 to 1 for the two output signals in each of the two one-by-two power splitters as long as each pair of the output differential signals have two equal power outputs, due to the fact that each pair of the differential signals are formed by signals from both one-by-two power splitters and not from the same one-by-two power splitter.

The corresponding effective resistance of the first one-by-two power splitter 615 and the second one-by-two power splitter 616 are equal so that the output signal is consistent. The first one-by-two power splitter 615 includes a first input end 501, a first output end 502 and a second output end 503, and the second one-by-two power splitter 616 includes a second input end 504, a third output end 505 and a fourth output end 506. A dielectric layer 605 is disposed over the resistor layer 602 and partially on the substrate 601. A conductive layer 603 is formed on the dielectric layer 605 and the vias (not shown) formed inside of the dielectric layer 605.

Figure 7C:
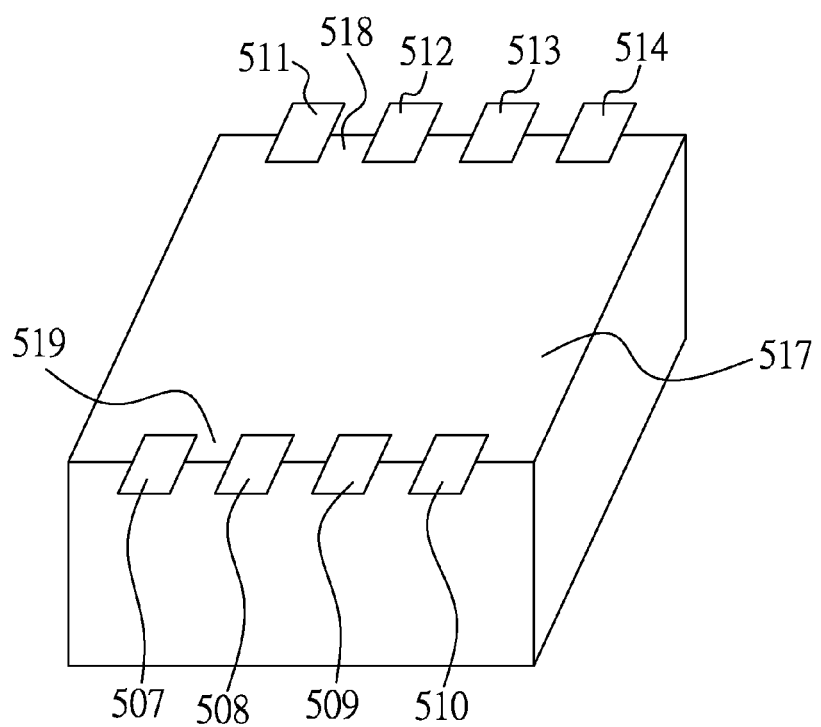
FIG. 7C is a perspective illustration of the input/output terminals of the monolithic power splitter of the first embodiment in the present invention.

As shown in FIG. 7C, the monolithic power splitter 62 further includes eight terminals on opposite sides of the top surface 517. FIG. 7C only illustrates the relative positions of I/O terminals and dummy terminals, wherein only a portion of I/O terminals or dummy terminals on the top surface is shown, and other elements, such as resistor layer, dielectric layer or conductive layer, are not shown. The eight terminals are also located on the conductive layer 603. Four terminals (a first dummy terminal 511, a first input terminal 512, a second input terminal 513 and a second dummy terminal 514) are disposed on one side 518 and other four terminals (a first output terminal 507, a second output terminal 508, a third output terminal 509 and a fourth output terminal 510) are disposed on opposite side 519. The first input end 501 is electrically connected to the first input terminal 512 and the second input end 504 is electrically connected to the second input terminal 513. The first output end 502 is electrically connected to the first output terminal 507, the third output end 505 is electrically connected to the second output terminal 508, the second output end 503 is electrically connected to the third output terminal 509 and the fourth output end 506 is electrically connected to the fourth output terminal 510. The abovementioned electrically connected paths are routed via the conductive layer 603 and the vias formed inside of the dielectric layer 605. The first dummy terminal 511 and the second dummy terminal 514 are dummy terminals which are not used for electrical connection. The dielectric layer 605 disposed between the resistor layer 602 and the conductive layer 603 is used to be a low-k dielectric layer to reduce capacitor effect between the resistor layer 602 and the conductive layer 603.

FIG. 7D to FIG. 7G illustrate a process flow of a method for manufacturing the monolithic power splitter 62 by thin-film process in the first embodiment in present invention. For convenience of explanation, some simplification is made and only the process of a portion of the structure of the monolithic power splitter 62 in the form of Δ-type is shown. Manufacturing method of the monolithic power splitter 62 in the form of Y-type, or any other equivalent type, is similar and technology of thin-film process can be readily appreciated by those skilled in the art, so it will not be further shown or described herein.

Figure 7D:
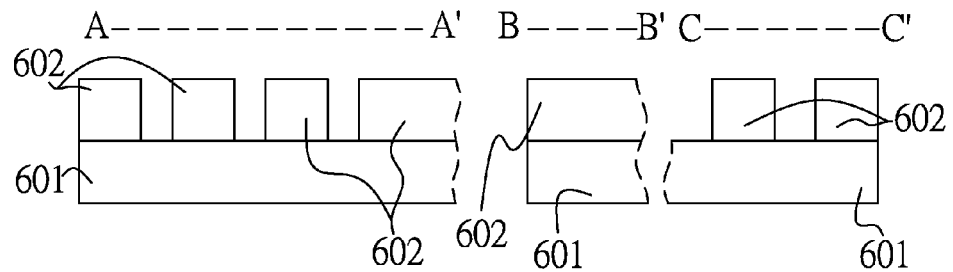
FIG. 7D~FIG. 7G illustrate a process flow of a method for manufacturing the monolithic power splitter in the first embodiment in present invention.
Figure 7E:
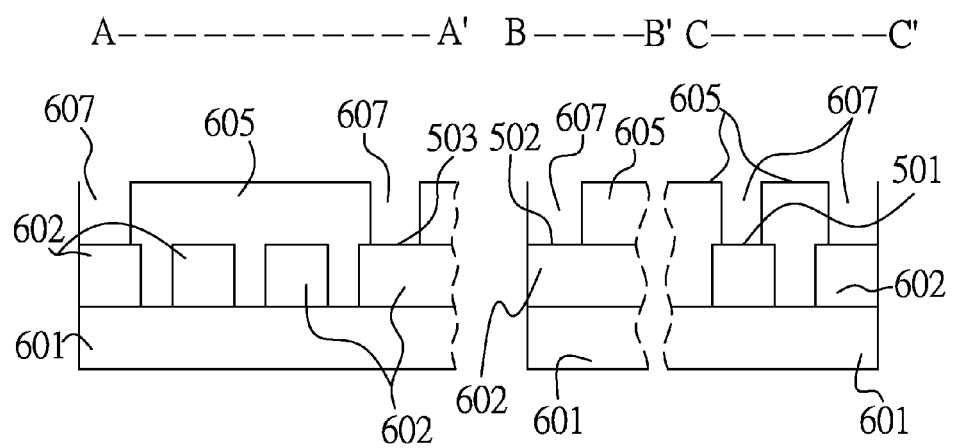
Figure 7F:
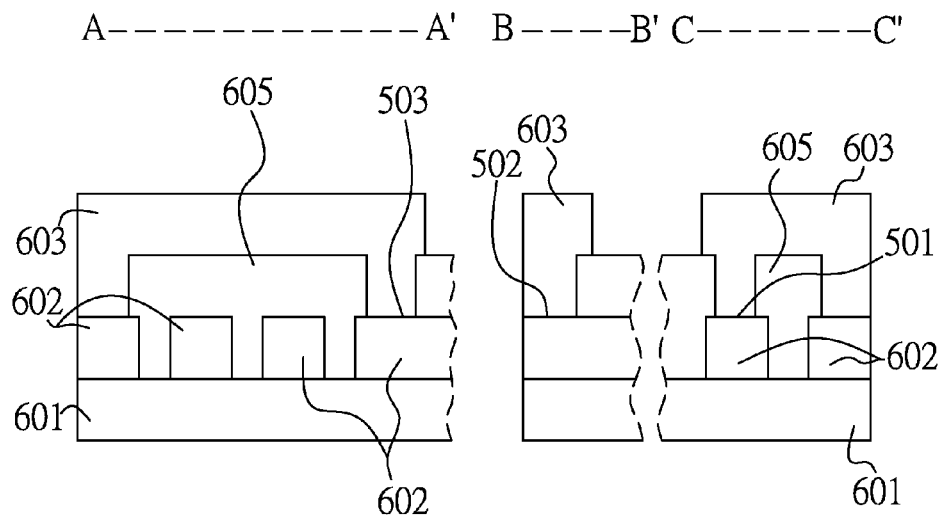

With reference to FIG. 7D to FIG. 7F, there is a flowchart in a perspective view of the method in the first embodiment in the present invention.

As shown in FIG. 7D, the substrate 601 is provided. The substrate 601 may include any suitable material, such as ceramic substrate. Subsequently, the resistor layer 602 is patterned on the substrate 601. The resistor layer 602 may include any suitable material, such as NiCr. The resistor layer 602 is formed by known techniques.

Next, as shown in FIG. 7E, the dielectric layer 605 is formed over the resistor layer 602 and partially on the substrate 601. The dielectric layer 605 may include any suitable material, such as low-k material: polymer, BCB or epoxy. The thickness of the dielectric layer 605 is 3~20 um. Subsequently, a plurality of vias 607 are formed inside of the dielectric layer 605 to expose the electrical connection terminals: the first input end 501, the first output end 502 and the second output end 503. The dielectric layer 605 is formed by any suitable technique, such as thin-film, lithographic and etching process.

Next, as shown in FIG. 7F, a conductive layer 603 is patterned on the dielectric layer 605 and filled with vias 607 formed inside of the dielectric layer 605 to contact the electrical connection terminals: the first input end 501, the first output end 502 and the second output end 503. The conductive layer 603 can be made of any conductive material, such as metallic material including Cu, Ag or a combination thereof. In another example, the conductive layer 603 comprises two conductive sub-layers, in which one sub-layer made of Ag is filled with the vias formed inside of the dielectric layer 605 and the other sub-layer made of Cu is formed on the dielectric layer 605, so that it's easy for PCB routing.

Figure 7G:
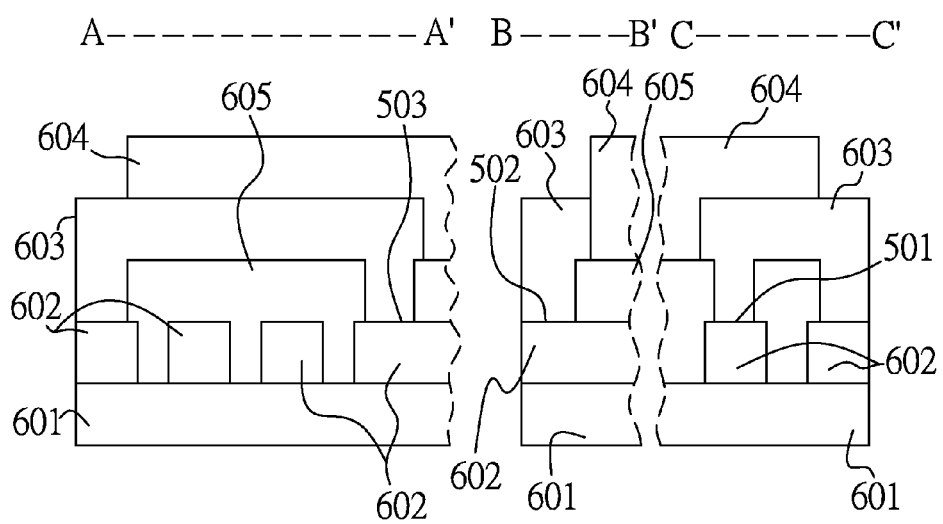

Next, as shown in FIG. 7G, a protective layer 604 is formed on the conductive layer 603 and partially on the dielectric layer 605.

Second Embodiment

In the second embodiment, the first one-by-two power splitter 110 and the second one-by-two power splitter 112 are made on opposite surfaces of the substrate by printing process. For convenience of explanation, some simplification is made and only the structure of a portion of the monolithic power splitter 62 performed by printing process is shown. It's also performed by thin-film process but not described herein.

Figure 8A:
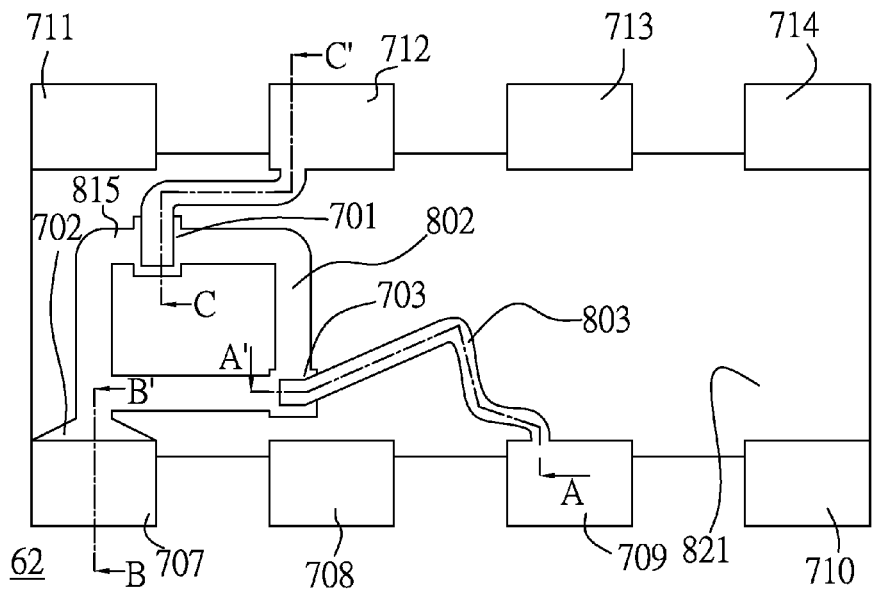
FIG. 8A is a top view of the structure of the monolithic power splitter of the second embodiment in the present invention.
Figure 8B:
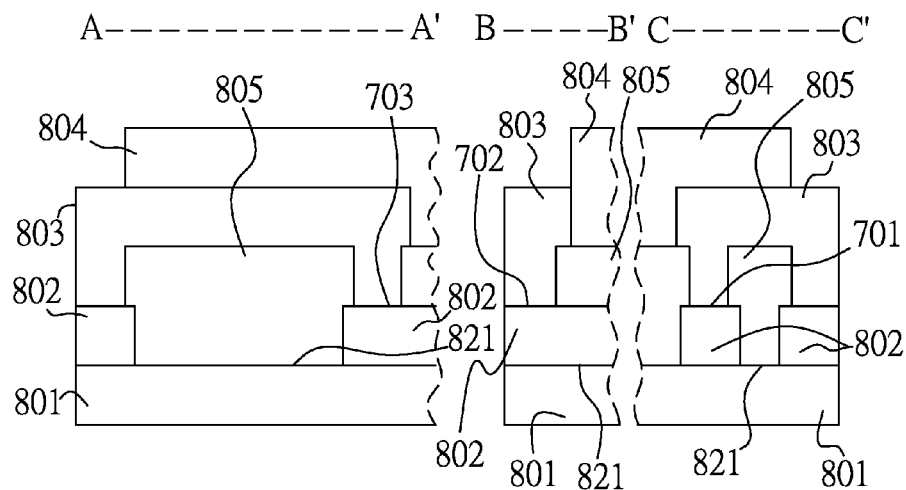
FIG. 8B is a schematic cross-sectional view of the structure of the monolithic power splitter of the second embodiment in the present invention.
Figure 9A:
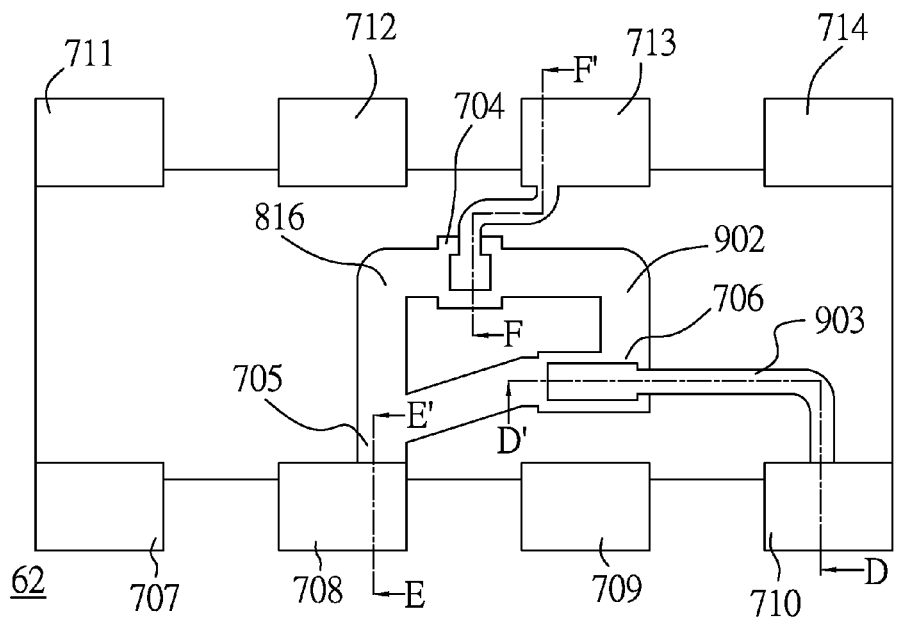
FIG. 9A is a bottom view of the structure of the monolithic power splitter of the second embodiment in the present invention.
Figure 9B:
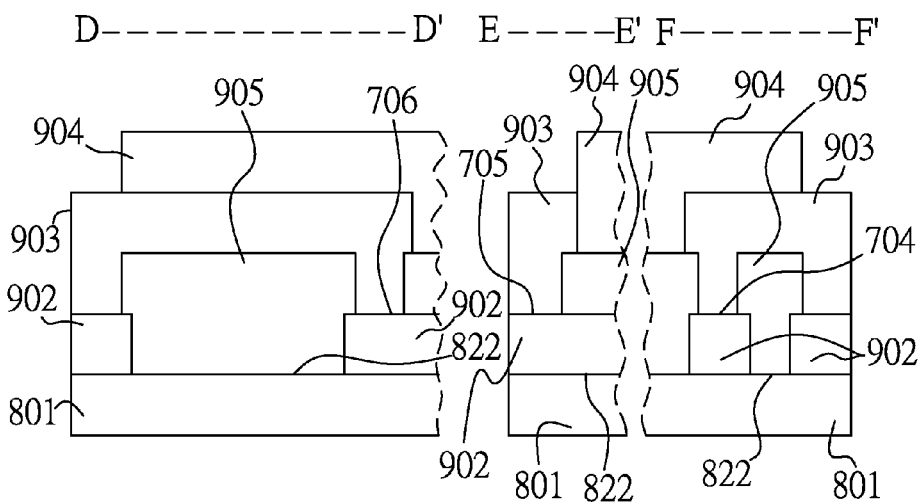
FIG. 9B is a schematic cross-sectional view of the structure of the monolithic power splitter of the second embodiment in the present invention.

FIG. 8A illustrates a top view of the structure of the monolithic power splitter 62 in the present invention. FIG. 8B illustrates a schematic cross-sectional view of the structure of the monolithic power splitter 62 of the present invention. In reference to both FIG. 8A and FIG. 8B together, sections A-A', B-B' and C-C' in FIG. 8B are taken along lines A-A', B-B' and C-C' shown in FIG. 8A respectively. For convenience of explanation, the above sections A-A', B-B' and C-C' are depicted in a single cross-sectional view respectively and combined in one figure. FIG. 9A illustrates a bottom view of the structure of the monolithic power splitter 62 in the present invention. FIG. 9B illustrates a schematic cross-sectional view of the structure of the monolithic power splitter 62 of the present invention. In reference to both FIG. 9A and FIG. 9B together, sections D-D', E-E' and F-F' in FIG. 9B are taken along lines D-D', E-E' and F-F' shown in FIG. 9A respectively. For convenience of explanation, the above sections D-D', E-E' and F-F' are depicted in a single cross-sectional view respectively and combined in one figure. Because the top view of the structure in FIG. 8A and the schematic cross-sectional view of the structure in FIG. 8B are similar to the bottom view of the structure in FIG. 9A and the schematic cross-sectional view of the structure in FIG. 9B. For convenience of explanation, some simplification is made and the top view of the structure in FIG. 8A, the bottom view of the structure in FIG. 9A and the schematic cross-sectional view of the structure in FIG. 9A and FIG. 9B are combined to described herein.

As shown in FIG. 8A, FIG. 8B, FIG. 9A and FIG. 9B, the monolithic power splitter 62 includes a substrate 801, a resistor layer 802 and 902, a conductive layer 803 and 903, a dielectric layer 805 and 905 and a protection layer 804 and 904.

The resistor layer 802 and 902 is disposed on the substrate 801. The substrate 801 with a top surface 821 and a bottom surface 822. The resistor layer 802 and 902 comprises a first one-by-two power splitter 815 and a second one-by-two power splitter 816 respectively. The first one-by-two power splitter 815 is on the top surface 821 and the second one-by-two power splitter 816 is on the bottom 822. The first one-by-two power splitter 815 and the second one-by-two power splitter 816 both include three resistors which are arranged in the form of Δ-type, Y-type, or any other equivalent type, as described above. The corresponding effective resistance of the first one-by-two power splitter 815 and the second one-by-two power splitter 816 are equal so that the output signal is consistent. The first one-by-two power splitter 815 includes a first input end 701, a first output end 702 and a second output end 703, and the second one-by-two power splitter 816 includes a second input end 704, a third output end 705 and a fourth output end 706. A dielectric layer 805 and 905 is disposed over the resistor layer 802 and 902 and partially on the substrate 801. A conductive layer 803 and 903 is formed on the dielectric layer 805 and 905 and the vias (not shown) formed inside of the dielectric layer 805 and 905.

Figure 8C:
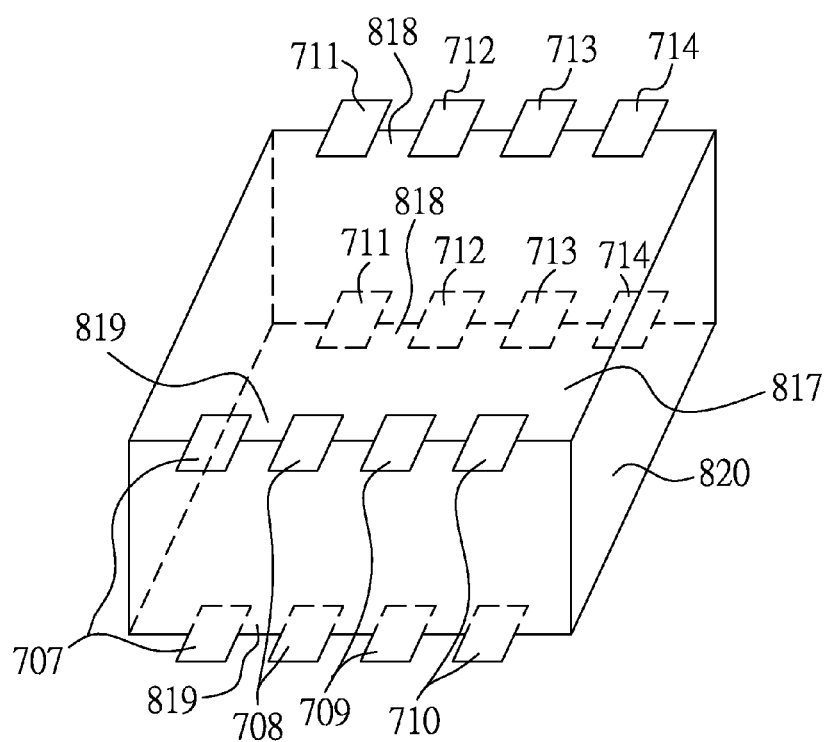
FIG. 8C is a perspective illustration of the input/output terminals of the monolithic power splitter of the second embodiment in the present invention.

As shown in FIG. 8C, the monolithic power splitter 62 further includes eight terminals on opposite sides of the top surface 817 and also on opposite sides of the bottom surface 820. FIG. 8C only illustrates the relative positions of I/O terminals and dummy terminals, wherein only a portion of I/O terminal or dummy terminals on the top surface and bottom surface is shown, and other elements, such as resistor layer, dielectric layer or conductive layer, are not shown. The eight terminals are also located on the conductive layer 803 and 903. Four terminals (a first dummy terminal 711, a first input terminal 712, a second input terminal 713 and a second dummy terminal 714) are disposed on one side 818 of the top surface 817 and the bottom surface 820, and other four terminals (a first output terminal 707, a second output terminal 708, a third output terminal 709 and a fourth output terminal 710) are disposed on opposite side 819 of the top surface 817 and the bottom surface 820. The first input end 701 is electrically connected to the first input terminal 712 and the second input end 704 is electrically connected to the second input terminal 713. The first output end 702 is electrically connected to the first output terminal 707, the third output end 705 is electrically connected to the second output terminal 708, the second output end 703 is electrically connected to the third output terminal 709 and the fourth output end 706 is electrically connected to the fourth output terminal 710. The abovementioned electrically connected path is routed via the conductive layer 803 and 903 and the vias formed inside of the dielectric layer 805 and 905. The first dummy terminal 711 and the second dummy terminal 714 are dummy terminals which are not used for electrical connection. The dielectric layer 805 and 905 disposed between the resistor layer 802 and 902 and the conductive layer 803 and 903 is used to be a low-k dielectric layer to reduce capacitor effect between the resistor layer 802 and 902 and the conductive layer 803 and 903.

Figure 10:
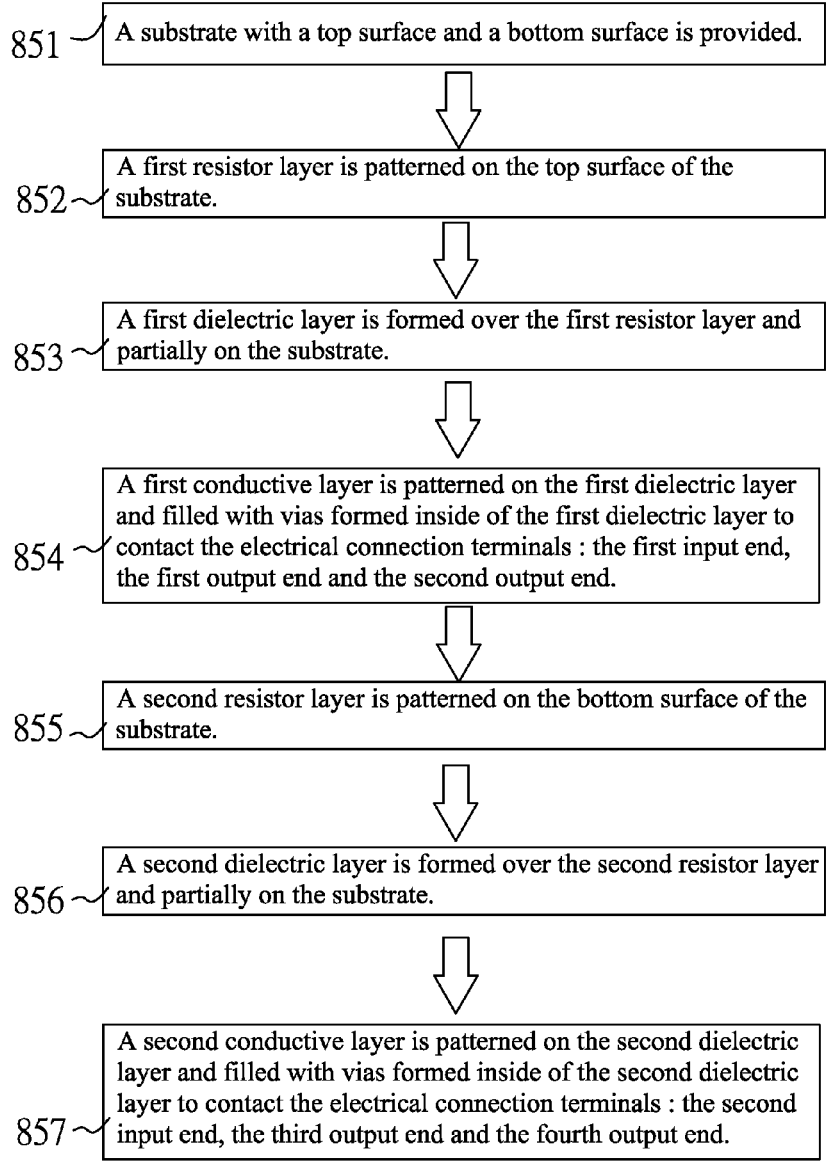
FIG. 10 is the method for manufacturing the monolithic power splitter in the second embodiment in the present invention.

FIG. 10 is the method for manufacturing the monolithic power splitter 62 by printing process in the second embodiment in the present invention. For convenience of explanation, some simplification is made and only the process of a portion of the monolithic power splitter 62 in the form of Δ-type is shown. Manufacturing method of the monolithic power splitter 62 in the form of Y type, or any other equivalent type is similar and technology of printing process can be readily appreciated by those skilled in the art, so it will not be further shown or described herein.

In block 851, a substrate 801 with a top surface 821 and a bottom surface 822 is provided. The substrate 801 may include any suitable material, such as ceramic substrate.

In block 852, a first resistor layer 802 is patterned on the top surface 821 of the substrate 801. The first resistor layer 802 may include any suitable material, such as NiCr. The first resistor layer 802 is formed by known techniques.

In block 853, a first dielectric layer 805 is formed over the first resistor layer 802 and partially on the substrate 801. The first dielectric layer 805 may include any suitable material, such as low-k material: polymer, BCB and epoxy. The thickness of the first dielectric layer 805 is 3~20 um. Subsequently, a plurality of vias (not shown) are formed inside of the first dielectric layer 805 to expose the electrical connection terminals: the first input end 701, the first output end 702 and the second output end 703. The first dielectric layer 805 is formed by any suitable technique.

In block 854, a first conductive layer 803 is patterned on the first dielectric layer 805 and filled with vias formed inside of the first dielectric layer 805 to contact the electrical connection terminals: the first input end 701, the first output end 702 and the first output end 703. The first conductive layer 803 can be made of any conductive material, such as metallic material including Cu, Ag or a combination thereof. In another example, the first conductive layer 803 comprises two conductive sub-layers, in which one sub-layer made of Ag is filled with the vias formed inside of the first dielectric layer 805 and the other sub-layer made of Cu is formed on the first dielectric layer 805, so that it's easy for PCB routing. Then a first protective layer 804 can be formed on the first conductive layer 803 and partially on the dielectric layer 805.

In block 855, a second resistor layer 902 is patterned on the bottom surface 822 of the substrate 801. The second resistor layer 902 may include any suitable material, such as NiCr. The second resistor layer 902 is formed by known techniques.

In block 856, a second dielectric layer 905 is formed over the second resistor layer 902 and partially on the substrate 801. The second dielectric layer 905 may include any suitable material, such as low-k material: polymer, BCB and epoxy. The thickness of the second dielectric layer 905 is 3~20 um. Subsequently, a plurality of vias (not shown) are formed inside of the second dielectric layer 905 to expose the electrical connection terminals: the second input end 704, the third output end 705 and the fourth output end 706. The second dielectric layer 905 is formed by any suitable technique.

In block 857, a second conductive layer 903 is patterned on the second dielectric layer 905 and filled with vias formed inside of the second dielectric layer 905 to contact the electrical connection terminals: the second input end 704, the third output terminal 705 and the fourth output terminal 706. The second conductive layer 903 can made of be any conductive material, such as metallic material including Cu, Ag or a combination thereof. In another example, the second conductive layer 903 comprises two conductive sub-layers, in which one sub-layer made of Ag is filled with the vias formed inside of the second dielectric layer 905 and the other sub-layer made of Cu is formed on the second dielectric layer 905, so that it's easy for PCB routing. Then a second protective layer 904 can be formed on the second conductive layer 903 and partially on the dielectric layer 905.

As described in the section of circuit description, the power splitter can be used as a power combiner based on the reciprocal property of the power splitter circuit. The directions of all the inputs and outputs of the differential signals in a monolithic power splitter are reversed when the monolithic power splitter is used as a monolithic power combiner while maintaining the advantages of the monolithic power splitter in terms of circuit characteristics. Therefore, all the terminals of the monolithic power splitter can be in either input or output direction depending upon the fact that it is acting as either a splitter or a combiner.

It follows from description of the above embodiments that the structure in the present invention and the method for manufacturing the same can offer many advantages including: 1. It reduce device pad size so that smaller PCB space is needed and it can be smaller and cheaper. 2. Shorter and fully symmetric routing on the PCB can be used for high speed. 3. It needs shorter transmission length, which can keep good signal quality. 4. It does not need additional voltage source if it is made by the IC process. 5. Uniform process on two one-by-two power splitters can get better balance characteristics.

The above disclosure is related to the detailed technical contents and inventive features thereof. People skilled in this field may proceed with a variety of modifications and replacements based on the disclosures and suggestions of the invention as described without departing from the characteristics thereof.

What is claimed is:

1. A monolithic power splitter for splitting a pair of input differential signal into two pairs of output differential signals, comprising:

a first input terminal to receive a first input signal of the pair of input differential signals;

a second input terminal to receive a second input signal of the pair of input differential signals, wherein the first input signal and the second input signal have substantially equal amplitude and 180 degree phase difference;

a first one-by-two power splitter to split the first input signal into a first output signal with a first phase shift relative to the first input signal and a second output signal with a second phase shift relative to the first input signal, comprising a first input end electrically connected with the first input terminal, a first output end to output the first output signal, and a second output end to output the second output signal, wherein the first phase shift and the second phase shift are substantially equal;

a second one-by-two power splitter to split the second input signal into a third output signal with a third phase shift relative to the second input signal and a fourth output signal with a fourth phase shift relative to the second input signal, comprising a second input end electrically connected with the second input terminal, a third output end to output the third output signal, and a fourth output end to output the fourth output signal, wherein the third phase shift and the fourth phase shift are substantially equal; and four output terminals to output two pairs of output differential signals, consisting of a first output terminal, a second output terminal, a third output terminal and a fourth output terminal, wherein the first output end, the second output end, the third output end, and the fourth end are one-to-one electrically connected to the four output terminals respectively, wherein each pair of the two pairs of output differential signals has two output signals with substantially equal amplitude and 180 degree phase difference, wherein the power of the first output signal and the second output signal are substantially equal; and the power of the third output signal and the fourth output signal are substantially equal.

2. The monolithic power splitter according to claim 1, wherein one pair of the two pairs of output differential signals are composed of the first output signal and the third output signal, and the other pair of the two pairs of output differential signals are composed of the second output signal and the fourth output signal.

3. The monolithic power splitter according to claim 1, wherein one pair of the two pairs output differential signals are composed of the first output signal and the fourth output signal, and the other pair of the two pairs of output differential signals are composed of the second output signal and the third output signal.

4. The monolithic power splitter according to claim 1, wherein the first output end, the second output end, the third output end, and the fourth output end are electrically connected to the first output terminal, the second output terminal, the third output terminal, and the fourth output terminal respectively.

5. The monolithic power splitter according to claim 1, wherein the first output end, the second output end, the third output end, and the fourth output end are electrically connected to the first output terminal, the third output terminal, the second output terminal, and the fourth output terminal respectively.

6. The monolithic power splitter according to claim 1, wherein the first output end, the second output end, the third output end, and the fourth output end are electrically connected to the fourth output terminal, the second output terminal, the third output terminal, and the first output terminal respectively.

7. The monolithic power splitter according to claim 1, wherein the first output end, the second output end, the third output end, and the fourth output end are electrically connected to the third output terminal, the fourth output terminal, the first output terminal, and the second output terminal respectively.

8. The monolithic power splitter according to claim 1, wherein the first one-by-two power splitter is either a Δ-type or Y-type power splitter.

9. The monolithic power splitter according to claim 1, wherein the second one-by-two power splitter is either a Δ-type or Y-type power splitter.

10. A monolithic power splitter, comprising:
a substrate;
a first resistor film on the substrate, comprising a first one-by-two power splitter having a first connection end, a second connection end and a third connection end; and
a second resistor film on the substrate, comprising a second one-by-two power splitter having a fourth connection end, a fifth connection end and a sixth connection end;
a first I/O terminal electrically connected to the first connection end to connect with a first signal end of a first pair of differential signals;
a second I/O terminal electrically connected to the fourth connection end to connect with a second signal end of the first pair of differential signals;
a third I/O terminal electrically connected to the second connection end to connect with a third signal end of a second pair of differential signals;
a fourth I/O terminal electrically connected to the fifth connection end to connect with a fourth signal end of the second pair of differential signals;
a fifth I/O terminal electrically connected to the third connection end to connect with a fifth signal end of a third pair of differential signals; and
a sixth I/O terminal electrically connected to the sixth connection end to connect with a sixth signal end of the third pair of differential signals, wherein the two signal ends of each pair of the differential signals have substantially equal amplitude and 180 degree phase difference; and the first resistor film and the second resistor film are either on the same side of the substrate or on the opposite sides of the substrate.

11. The monolithic power splitter according to claim 10, wherein the first I/O terminal and the second I/O terminal are in input directions to receive the first pair of differential signals; the third I/O terminal and the fourth I/O terminal are in output directions to output the second pair of differential signals; and the fifth I/O terminal and the sixth I/O terminal are in output directions to output the third pair of differential signals.

12. The monolithic power splitter according to claim 10, wherein the third I/O terminal and the fourth I/O terminal are in input directions to input the second pair of differential signals; the fifth I/O terminal and the sixth I/O terminal are in input directions to input the third pair of differential signals; and the first I/O terminal and the second I/O terminal are in output directions to output the first pair of differential signals.

13. The monolithic power splitter according to claim 10, wherein the first one-by-two power splitter is made by a first pattern of the first resistor film to form three resistors and the second one-by-two power splitter is made by a second pattern of the second resistor film to form three resistors, wherein the first pattern of the first resistor film is symmetrical to the second pattern of the second resistor film.

14. The monolithic power splitter according to claim 13, wherein both of the first pattern of the first resistor film and the second pattern of the second resistor film are either Δ-type or Y-type.

15. The monolithic power splitter according to claim 10, wherein a dielectric layer is formed on at least one of the first one-by-two power splitter and the second one-by-two power splitter, and the dielectric layer is made of low-k material.

16. The monolithic power splitter according to claim 15, wherein the low-k material comprises at least one of polymer, BCB and epoxy.

17. The monolithic power splitter according to claim 15, wherein thickness of the dielectric layer is 3 ~20 um.

18. The monolithic power splitter according to claim 15, wherein a conductive layer is formed on the dielectric layer and the conductive layer is made of metallic material.

19. The monolithic power splitter according to claim 18, wherein metallic material comprises at least one of Cu and Ag.

20. A method for manufacturing a monolithic power splitter, comprising the steps of:
a. providing a substrate;
b. forming a first resistor film on the substrate to form a first one-by-two power splitter having a first connection end, a second connection end and a third connection end;
c. forming a second resistor film on the substrate to form a second one-by-two power splitter having a fourth connection end, a fifth connection end and a sixth connection end;

d. forming a first I/O terminal electrically connected to the first connection end to connect with a first signal end of a first pair of differential signals;
e. forming a second I/O terminal electrically connected to the fourth connection end to connect with a second signal end of the first pair of differential signals;
f. forming a third I/O terminal electrically connected to the second connection end to connect with a third signal end of a second pair of differential signals;
g. forming a fourth I/O terminal electrically connected to the fifth connection end to connect with a fourth signal end of the second pair of differential signals;
h. forming a fifth I/O terminal electrically connected to the third connection end to connect with a fifth signal end of a third pair of differential signals; and
i. forming a sixth I/O terminal electrically connected to the sixth connection end to connect with a sixth signal end of the third pair of differential signals, wherein the two signal ends of each pair of the differential signals have substantially equal amplitude and 180 degree phase difference; and the first resistor film and the second resistor film are either on the same side of the substrate or on the opposite sides of the substrate.

21. The method according to claim 20, wherein at least one of step b~step i is performed by either printing process or thin-film process.

* * * * *